US012690412B2

(12) United States Patent
Basutkar et al.

(10) Patent No.: US 12,690,412 B2
(45) Date of Patent: Jul. 21, 2026

(54) VERIFYING ALIGNMENT OF MULTIPLE DIE ON A SUBSTRATE

(71) Applicant: International Business Machines Corporation, Armonk, NY (US)

(72) Inventors: Monali Naresh Basutkar, Danbury, CT (US); Christopher Muzzy, Burlington, VT (US); Steven Paul Ostrander, Poughkeepsie, NY (US); Thomas Weiss, Poughkeepsie, NY (US); Thomas Anthony Wassick, LaGrangeville, NY (US); Brian W. Quinlan, Poughkeepsie, NY (US); Kurt Alan Smith, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 18/656,923

(22) Filed: May 7, 2024

(65) Prior Publication Data

US 2025/0349580 A1 Nov. 13, 2025

(51) Int. Cl.
B23K 1/00 (2006.01)
B23K 3/08 (2006.01)
(Continued)

(52) U.S. Cl.
CPC ........ H10P 72/0606 (2026.01); B23K 1/0016 (2013.01); B23K 3/08 (2013.01);
(Continued)

(58) Field of Classification Search
None
See application file for complete search history.

(56) References Cited

U.S. PATENT DOCUMENTS

| | | | |
|---|---|---|---|
| 7,881,580 B2 * | 2/2011 | Watanabe | ............ G02B 6/4227 |
| | | | 385/91 |
| 9,625,256 B1 | 4/2017 | Muthur Srinath et al. | |

(Continued)

FOREIGN PATENT DOCUMENTS

| | | |
|---|---|---|
| CN | 112666806 A | 4/2021 |
| CN | 112018082 B | 6/2022 |

(Continued)

OTHER PUBLICATIONS

Ku, Y.-S., et al., "Infrared differential interference contrast microscopy for 3D interconnect overlay metrology", 2013, pp. 18884-18898, vol. 21, Issue 16.

*Primary Examiner* — Jacob J Cigna
(74) *Attorney, Agent, or Firm* — Scully, Scott, Murphy & Presser, P.C.; Yuanmin Cai

(57) ABSTRACT

A top-down inspection system and method employs a strategy using specific geometric shaped metal alignment markers on a semiconductor die and a laminate that can be inspected using an IR camera. The metal alignment markers will align at room temperature to assess the die alignment prior to reflowing it. As silicon is transparent to IR wavelengths the system allows for the IR light to pass through the die to the laminate to see alignment features on the die and the laminate concurrently. The specific markers are placed in at least two separate locations preferably >0.5*die size apart. The robust alignment markers are substantially resistant to degradation caused by semiconductor device fabrication steps. The metal alignment markers can be small geometrical shapes to provide a more symmetrical signal which is more resistant to variability in prior processing steps than the standard marker design.

20 Claims, 7 Drawing Sheets

(51) Int. Cl.
  H10P 72/00  (2026.01)
  H10P 74/00  (2026.01)
  H10W 46/00  (2026.01)
  H10W 72/00  (2026.01)

(52) U.S. Cl.
  CPC ............. *H10P 74/23* (2026.01); *H10W 46/00*
   (2026.01); *H10W 46/101* (2026.01); *H10W*
   *46/301* (2026.01); *H10W 72/07183* (2026.01);
   *H10W 72/07221* (2026.01); *H10W 72/07231*
   (2026.01); *H10W 72/07236* (2026.01)

(56)      References Cited

U.S. PATENT DOCUMENTS

| | | | |
|---|---|---|---|
| 10,490,508 B2 | 11/2019 | Kodama | |
| 10,636,688 B2 | 4/2020 | Wang et al. | |
| 11,631,652 B2 * | 4/2023 | Huang ................. | H01L 21/187 |
| | | | 438/458 |
| 2006/0249859 A1 * | 11/2006 | Eiles ...................... | H01L 24/94 |
| | | | 257/E23.179 |
| 2021/0375781 A1 | 12/2021 | Lin et al. | |
| 2022/0165677 A1 | 5/2022 | Kloster et al. | |
| 2023/0008405 A1 | 1/2023 | Toshishige et al. | |
| 2023/0307412 A1 * | 9/2023 | Chang ................. | H01L 23/544 |

FOREIGN PATENT DOCUMENTS

| | | | |
|---|---|---|---|
| JP | S6329540 A | 2/1988 | |
| JP | H10125728 A | 5/1998 | |
| JP | 6411823 B2 | 10/2018 | |

* cited by examiner

200

Align die center
to substrate center
with optical camera
250

Place die
on substrate 260

IR
reflection
Verify
Alignment
270

Permanently
attach 280

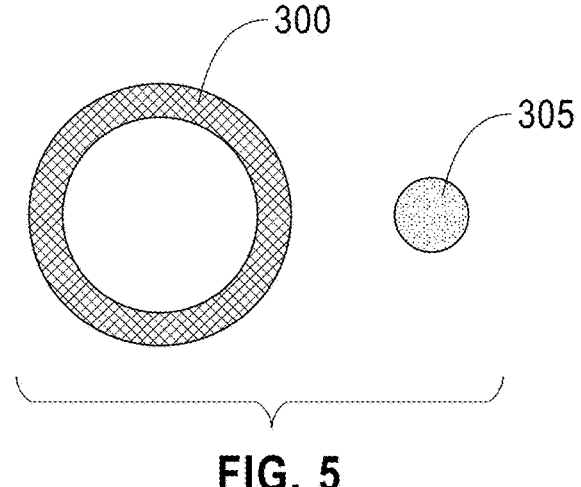
FIG. 5
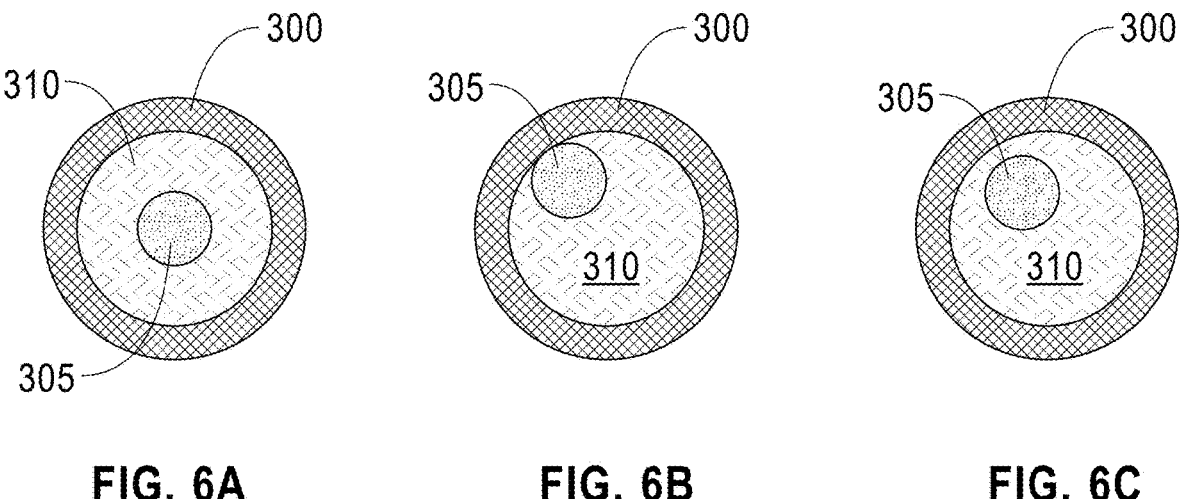
FIG. 6A        FIG. 6B        FIG. 6C

VERIFYING ALIGNMENT OF MULTIPLE DIE ON A SUBSTRATE

FIELD

The invention relates generally to a robust die alignment scheme including use of robust alignment markers which improve the accuracy of an alignment of multiple dies during the fabricating of a semiconductor assembly such as flip-chip electronic modules.

BACKGROUND

Many steps of the semiconductor manufacturing process require highly precise alignment, such as the photolithography process, wafer probe and test, wafer mounting, and dicing.

For example, during the bond and assembly of flip-chip (die which are flipped to attach to substrate) electronic modules, verification of alignment and/or correct positioning is an important step prior to final permanent attach or reflow process where the die is attached to a printed circuit board (PCB). This can be done with a sampling plan-usually depending on the value. Failure to detect a misalignment prior to reflow will lead to the loss of the entire module (die+substrate+discrete components) since any misalignment detected after reflow is irreversible. As the number of die in electronic modules increases, the cost of failing to detect also increases.

SUMMARY OF THE INVENTION

The present disclosure relates to semiconductor packages generally and more specifically an improved system and method for aligning an electronic module or die to be joined to one of a semiconductor substrate, an interposer or an organic laminate carrier structure.

In accordance with a first aspect, there is provided a system for joining an electronic module to a laminate structure. The system comprises: an assembly comprising an electronic module disposed on a laminate structure to be joined to the electronic module, the electronic module having a first alignment marker and the laminate structure having a second alignment marker; an in-line infrared (IR) light inspection apparatus disposed above the assembly, the IR light inspection apparatus comprising: an infrared light source providing incident IR light upon the assembly; an IR camera for obtaining images based on IR light reflected from the assembly, the obtained images including a relative positioning of the concurrent locations of the first alignment marker and the second alignment marker; and a solder reflow apparatus configured to perform or not perform a solder reflow process to electrically join the electronic module to the laminate structure in response to a concurrent positioning of the location of the first alignment marker relative to the location of the second alignment marker.

In accordance with a further aspect, there is provided a method of verifying alignment of electronic structures to laminates. The method comprises: providing an assembly comprising an electronic module situated on a laminate to be joined to the electronic module, the electronic module having a first alignment marker and the laminate structure having a second alignment marker; providing incident infrared (IR) light to the assembly from a location above the assembly; obtaining images based on IR light reflected from the assembly, the obtained images including concurrent locations of the first alignment marker and the second alignment marker; detecting, based on the concurrent locations of the first alignment marker and the second alignment marker, a degree of alignment between the electronic module and laminate; and one of: performing, based on the detected degree of alignment, a solder reflow process to electrically join the electronic module to the laminate structure or alternatively to prevent the reflow process.

In yet another aspect, there is provided an apparatus for verifying an alignment of an electronic module to a laminate structure. The apparatus comprises: an in-line infrared (IR) inspection apparatus comprising: an infrared (IR) light source; and an IR camera for receiving reflected IR light, the IR light source disposed vertically above a carrier holding an assembly comprising an electronic module situated on a laminate structure to be joined to said electronic module, the electronic module having a first alignment marker and the laminate structure having a second alignment marker, the first alignment marker and second alignment marker being separated by a pre-determined distance, and the IR light source providing incident IR light upon the carrier and the IR camera receiving reflected IR light signals providing images comprising concurrent location of the first alignment marker relative to the second alignment marker, wherein the alignment of the electronic module to said laminate structure is verified or not verified based on the relative locations of the first alignment marker and second alignment marker.

In an aspect, the first and second alignment markers comprise a geometric-shaped structure, the geometric-shaped structure including but not limited to: a circle, a ring, concentric rings, a symmetric orientation of a plurality of squares, a cross, an in-line series of rectangles.

Further features, as well as the structure and operation of various embodiments, are described in detail below with reference to the accompanying drawings. In the drawings, like reference numbers indicate identical or functionally similar elements.

BRIEF DESCRIPTION OF THE DRAWINGS

FIG. 5 depicts an example of an IR fiducial marker to be formed on the electronic module (or die) and a corresponding further IR fiducial marker to be formed on the organic laminate (or substrate) according to an embodiment;

FIGS. 6A-6C depict the different results of optically exposing the separated die and substrate/laminate to IR light and observing the IR light reflections using the IR fiducial markers of FIG. 5;

DETAILED DESCRIPTION

Figures 1, 2A, 2B, 2C:
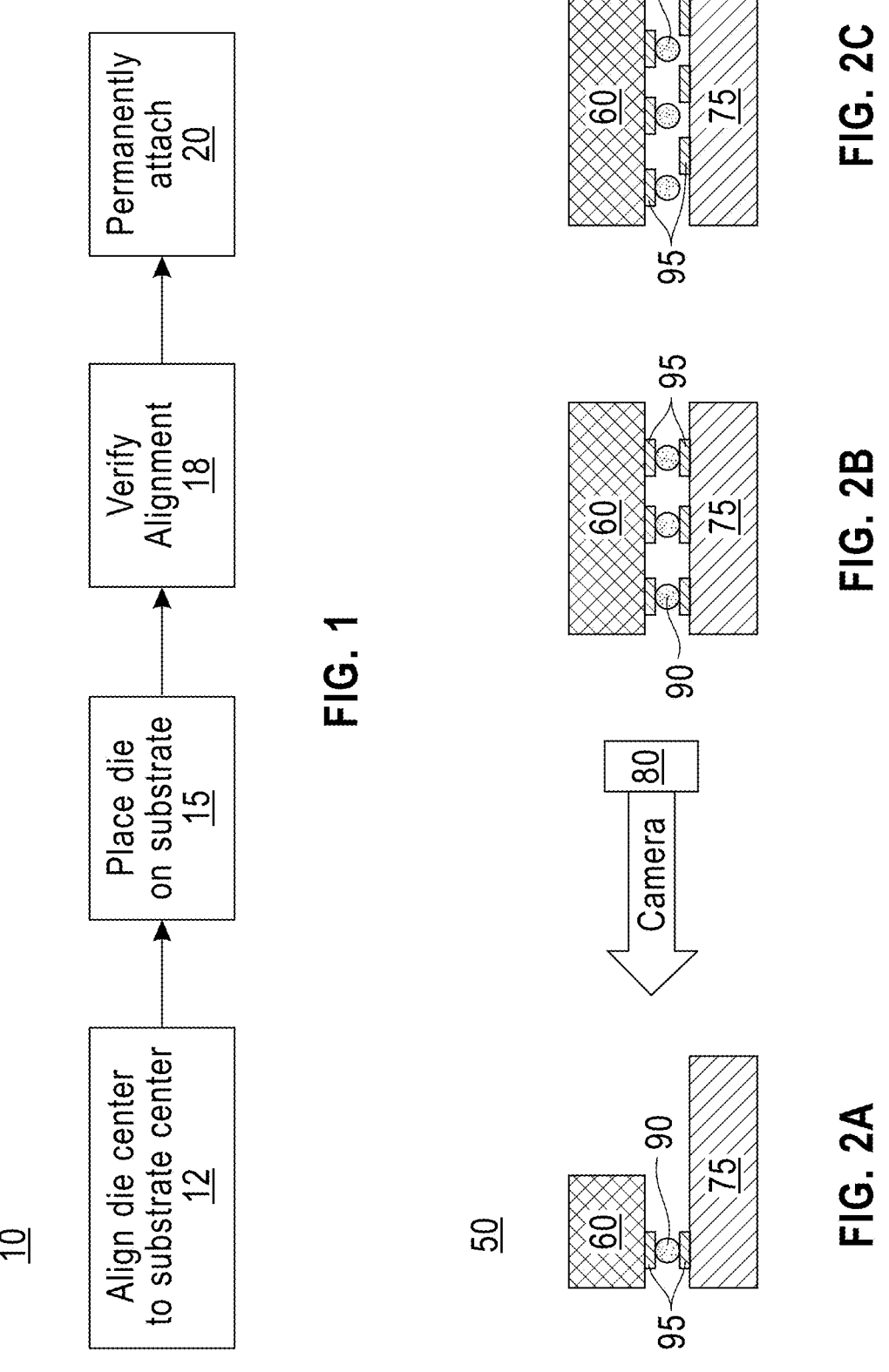
FIG. 1 depicts a generic method flow of the general steps for the bond and assembly of a flip-chip (die or electronic module which is flipped) to attach to a substrate or laminate.
FIG. 2A shoes a conventional flip-chip die bonding process employing a camera to verify alignment using a side view to verify alignment of the die prior to bonding to a substrate.
FIG. 2B depicts a view as seen by the camera showing a single die aligned with the underlying substrate.
FIG. 2C depicts a view as seen by the camera showing a single die un-aligned with the underlying substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Many steps of the semiconductor manufacturing processes and assembly of electronic modules such as flip-chip dies on a substrate, require highly precise alignment and placement.

FIG. 1 depicts a generic method flow 10 of the general steps for the bond and assembly of a flip-chip (silicon die or electronic module which is flipped) to attach to a semiconductor substrate, interposer or organic laminate substrate. A first general step 12 requires the aligning of the die at a position (e.g., center) to a substrate center and then the placing of the die on the substrate 15. Before permanently attaching the die to the substrate 20, the process requires a verification of the alignment of the die to the substrate 18.

As shown in FIG. 2A, in conventional flip-chip die bonding process, using a die bonder tool, a die 60 (which is flipped) taken from a dicing wafer is picked (e.g., by a vacuum/plunger mechanism) is placed on any kind of substrate 75 (e.g., a semiconductor substrate, a lead frame or PCB or organic laminate) for attachment thereto. As shown in FIG. 2B, a single die alignment step is performed to verify with a side camera, the alignment prior to reflow on at least 2 sides (1 X, 1 Y view). In FIG. 2B, in a view as seen by the side camera 80, i.e., a camera oriented and focused on a side view of the die and substrate, the single silicon die 60 is depicted as aligned with the underlying substrate 75, i.e., solder bumps 90 and corresponding pads 95 are aligned such that there is complete electrical connection between the die and the underlying substrate. The solder bumps 90 can be plated on the chips. However, in a view as seen by a side camera 80 as depicted in FIG. 2C, the single die 60 is mis-aligned with the underlying substrate 75, i.e., solder bumps 90 and corresponding pads 95 are not aligned and little or insufficient electrical connection is achieved between the die and the substrate.

It is the case that multiple die placed with minimal (close) spacing between them prevents use of a side camera 80. Further, performance enhancements that place surface components as close as possible to the die prevents use of side camera.

Furthermore, current side camera methodology can not detect die placement rotation.

As organic laminate substrates have a much different coefficient of thermal expansion (CTE) than the die, then interconnect pads are compensated in X, Y position for the final joining temperature which can impact how the results are interpreted.

In an embodiment, a top-down inspection strategy employing an IR alignment inspection apparatus is used to verify alignment. The top-down inspection strategy initially includes a setting up of specific shaped metal alignment marks (or markers) formed on the surfaces of or embedded within the die and a laminate that can be inspected using an infrared (IR) camera. The metal marks will align at room temperature to assess the die alignment with the laminate prior to reflowing it.

Figure 3:
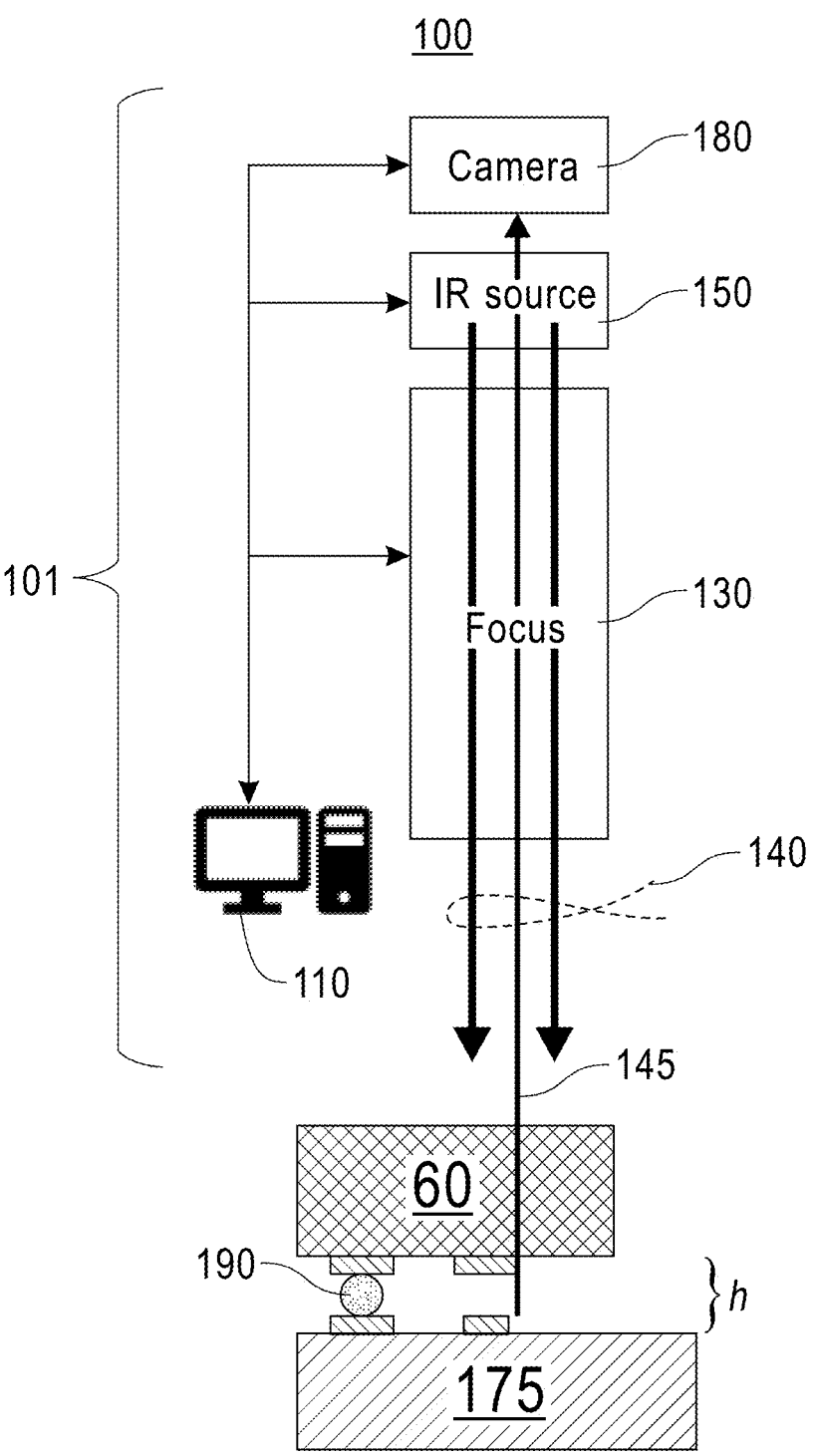
FIG. 3 shows an exemplary columnar IR alignment inspection apparatus for verifying the alignment of multiple dies on a substrate.

FIG. 3 shows an exemplary IR alignment inspection apparatus 100 for verifying the alignment of multiple dies on a substrate such as an organic laminate. In a non-limiting embodiment, the apparatus is a columnar arrangement 101 and includes a camera 180 positioned at a top position, an IR light source 150 positioned underlying the camera, and a focusing element 130 positioned underlying the IR light source 150 for focusing the incident IR light downward upon the separated die 60 and laminate 175. This columnar arrangement is overlying (disposed directly above) the die 60 and substrate or organic laminate 175 element being attached during a reflow process. Further, in an embodiment, the IR camera 180 in the columnar arrangement for die-alignment verification on a carrier utilizes metal fiducial marks on two different levels, i.e., one on the die and one on the organic laminate or substrate, that are separated. In an embodiment, the fiducial marks on the two different levels are separated by a height "h" where h>20 μm that are viewed concurrently, i.e., the relative positioning of the concurrent locations of the separated two fiducial marks on the two different levels are obtained at the same time. That is, as silicon is transparent to IR wavelengths (~700 nm-1700 nm), this allows for the IR light 140 to pass through the silicon die to the laminate to concurrently see alignment features (markers) on both the die 60 and the laminate concurrently. The specific marks are placed in at least two separate locations preferably >0.5*die size apart. For example, given a 20 mm chip, the two fiducial marks are spaced on two separate levels at least 10 mm apart. As shown in FIG. 3, the IR inspection apparatus 100 includes a computer-based apparatus or like control processor 110 that interfaces with the camera 180, IR source 150 and focusing element 130 to ensure alignment of the pads and/or (solder) bump structures 190 formed on either or both the die 60 and laminate 175. The instant embodiments illustrate the invention within the context of metal alignment structures or alignment marks that are formed and located within or at a surface of a semiconductor structure, i.e., die 60, and corresponding or complementary metal alignment structures or alignment marks formed and located on a bulk semiconductor structure or organic laminate 175 to facilitate superior overlay alignment accuracy. The metal alignment structures formed on the die according to the embodiments herein can be formed using standard semiconductor manufacturing techniques, e.g., damascene or subtractive etch processes for copper levels and can be formed at the same time when forming other structures in the chip. These markers can be formed at one or more edges or corners of the chip or die. In an embodiment, the metal fiducial marks are structures formed of a metal material such as tantalum, tungsten, titanium, niobium, molybdenum, copper, aluminum, and alloys thereof. The metal alignment structures formed on the laminate according to the embodiments herein can be formed using subtractive etching, build-up processes or a plate-up (e.g., electroplating process) techniques.

Figure 4:
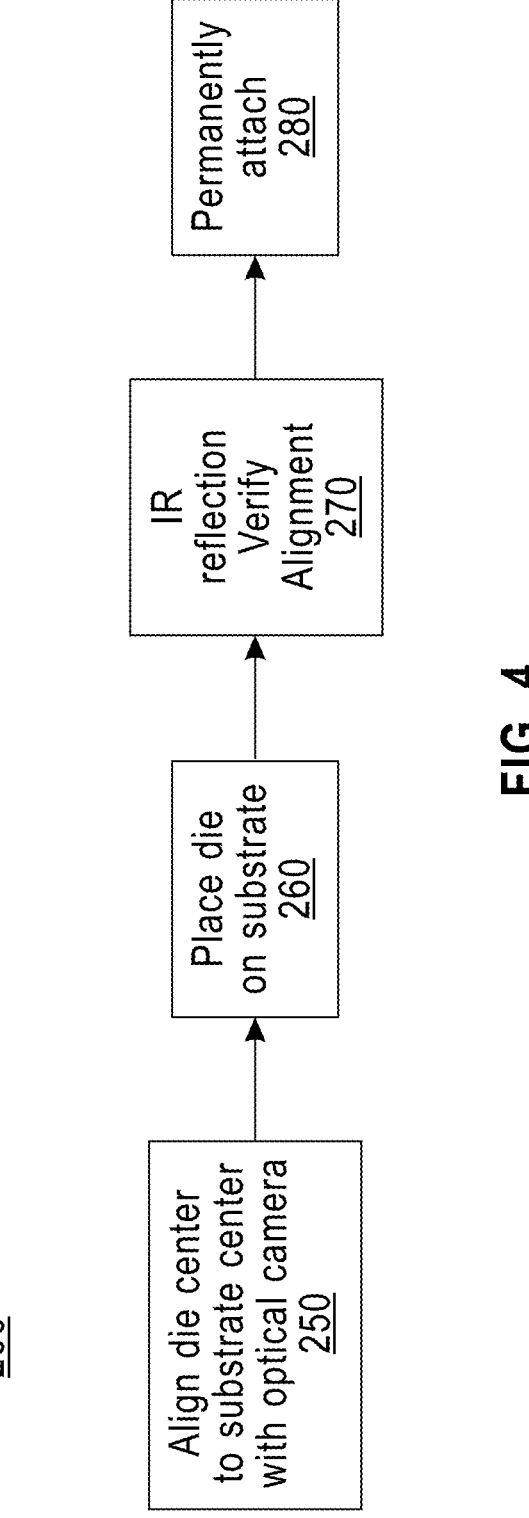
FIG. 4 depicts a method flow of the general steps for the bond and assembly of a flip-chip to attach to a bulk semiconductor substrate or organic laminate according to the embodiments herein.

FIG. 4 depicts a method flow 200 of the general steps for the bond and assembly of a flip-chip (silicon die or electronic module which is flipped) to attach to a bulk semiconductor substrate or organic laminate according to the embodiments herein. The first general step 250 requires the aligning of the die at a position (e.g., center) to a substrate center with the optical camera 180, and then the placing of the die on the substrate at 260. Before permanently attaching the die to the substrate at 280 using a solder reflow process or compression bonding process, the process requires obtaining an Infrared (IR) light reflection 145 for verification of the alignment of the die to the substrate at 270.

In an embodiment, the method 270 for verifying the alignment of multiple dies on a substrate involves the forming and incorporating metal fiducials of a particular geometric form on both the die 60 and the laminate 175. As known, a fiducial marker, or like circuit pattern recognition mark, is an object or element manufactured using semiconductor lithographic processes that is placed in the field of view of an imaging system 100 that appears in the image produced, for use as a point of reference. In an embodiment, an IR fiducial mark or set of marks is formed on the imaging subjects, i.e., die and organic laminate or substrate. Use of fiducial markers allows surface mount technology placement equipment to accurately locate and place the die on the laminate. In embodiments, these fiducials have different designs and sizes based on the bump sizes and the magnitude of any offset which is to be detected. That is, the design (geometries) of the fiducials are used to detect any amount of mis-alignment that may be needed to ensure they are aligned after the placement.

After placement of the die 60 proximate the substrate or organic laminate 175 prior to reflow placement, the method involves automatically inspecting the alignment using a computer-controlled columnar or in-line IR inspection system 100 to determine a go/no-go per specification and a tolerance. Using the IR fiducial marks, if the die 60 is detected as being aligned to the laminate 175, it is reflowed. If the die 60 is misaligned, it is sent for rework that prevents module/yield loss due to misalignment. The method will allow for both manual interpretation of results and automated exact measuring of any mis-alignment or offset in the X and Y directions by a computer-based apparatus or like control processor 110.

FIG. 5 depicts an example of a top-down view of an IR fiducial marker 300 to be formed on either of the die (or organic laminate or substrate) and a further IR fiducial marker 305 to be formed on the other of the organic laminate or substrate (or die). For non-limiting illustrative purposes, the IR fiducial marker 300 is a metal structure formed on a top or bottom surface of the substrate or organic laminate 175 and the corresponding second IR fiducial marker 305 is formed on the top or bottom surface of the die 60. In this embodiment, IR fiducial marker 300 is ring-shaped metal structure having a diameter of approximately 150 μm but the diameters can range anywhere from between 75 μm to 225 μm. Further, in this embodiment, the corresponding IR fiducial marker 305 is a circular metal structure having a diameter of approximately 50 μm but can range anywhere from between 20 μm to 80 μm. As described, the imaging of the fiducials 300, 305 as obtained in the columnar IR alignment inspection apparatus 100 gives a clear indication of go/no-go conditions of die alignment for easy operator detection. In an example implementation depicted in FIG. 5, the 150 μm and 50 μm diameters of the respective fiducials 300, 305 are designed based on a 75 μm bump pitch (distance between successive solder bumps). In further embodiments, the size of the entire fiducial feature can cross twice the size of the pitch. For example, a 60 μm bump pitch may use 120 μm and 40 μm for fiducials 300, 305.

FIG. 6A shows the results of optically exposing the separated die and substrate/laminate to IR light and observing the IR light reflections 145 of the IR fiducials as received by the IR camera corresponding to a case of the die 60 being aligned to the laminate 175. In FIG. 6A, the IR alignment inspection apparatus 100 can detect a reflection showing the IR fiducial marker 305 of the die placed clearly within the inner portion 310 of the ring-shaped IR fiducial marker 300. In this embodiment, when the die is aligned to the laminate, the die fiducial 305 will be centered on the laminate fiducial 300 and which is indicative of an acceptable alignment of the pads/C4 or solder bumps. Upon such alignment detection shown in FIG. 6A, the system may then proceed with the die reflow to join the die and laminate.

In contrast, FIG. 6B shows the results of optically exposing the separated die and substrate/laminate to IR light and observing the IR light reflections 145 of the IR fiducials as received by the IR camera corresponding to the die 60 being mis-aligned to the laminate 175. In FIG. 6B, the columnar IR alignment inspection apparatus 100 can detect a reflection showing the IR fiducial marker 305 of the die having a portion or edge touching the inner portion 310 of the ring-shaped IR fiducial marker 300. An edge of IR fiducial marker 305 detected as touching any portion of the ring-shaped IR fiducial marker 300 is indicative of a mis-alignment of the pads/C4 or solder bumps of the die and laminate. In FIG. 6B, when the die is detected as offset/misaligned beyond acceptable limits, the die fiducial will touch the laminate fiducial, i.e., the distance between the two fiducials is designed based on acceptable offset limits. At any instance that there is no gap between the die and laminate fiducial, it is a clear no-go condition and will trigger a rework.

FIG. 6C shows the results of optically exposing the separated die and substrate/laminate to IR light and observing the IR light reflections 145 of the IR fiducials as received by the IR camera corresponding to the die 60 being aligned to the laminate 175. In FIG. 6A, the IR alignment inspection apparatus 100 can detect a reflection showing the IR fiducial marker 305 of the die placed within the inner portion 310 of the ring-shaped IR fiducial marker 300 however is offset from the laminate-center. An edge of IR fiducial marker 305 not touching any portion of the ring-shaped IR fiducial marker 300 yet offset from the laminate-center is indicative of an acceptable alignment of the pads/C4 or solder bumps of the die and laminate. If the die fiducial 305 is offset from the laminate fiducial 300 but not touching it, it indicates that the die is within acceptable limits of self-alignment during reflow and is not a problem.

Depending on allowable shapes based on die/laminate/interposer groundrules, octagons (or other similar geometric shapes) could be substituted for the ring-shape or circles.

Figures 7, 8A, 8B, 8C:
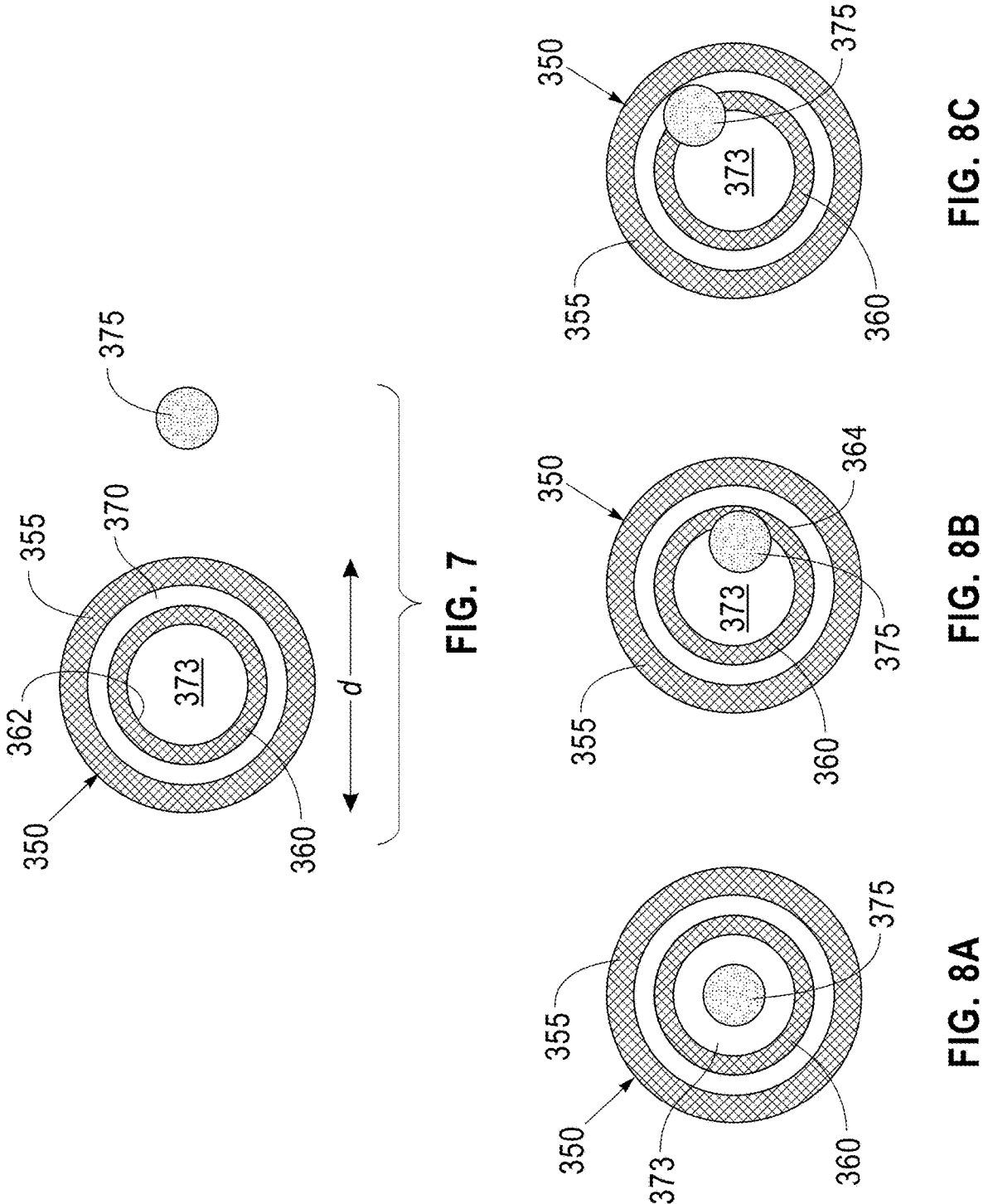
FIG. 7 depicts a further example of an IR fiducial marker to be formed on the electronic module (or die) and a corresponding further IR fiducial marker to be formed on the organic laminate (or substrate) according to an embodiment.
FIGS. 8A-8C depict the different results of optically exposing the separated die and substrate/laminate to IR light and observing the IR light reflections using the IR fiducial markers of FIG. 7.

FIG. 7 depicts a top-down view of a further example of an IR fiducial marker 350 to be formed on either of the die (or organic laminate or substrate) and a further IR fiducial marker 375 to be formed on the other of the organic laminate or substrate (or die). For non-limiting illustrative purposes, the IR fiducial marker 350 is placed on a top or bottom surface of the substrate or organic laminate 175 and the corresponding second IR fiducial marker 375 is formed on the top or bottom surface of the die 60. In this embodiment, IR fiducial marker 350 is a metal structure comprising concentric ring-shaped metal structures: an outer ring structure 355 and an inner ring structure 360. In a non-limiting illustrative embodiment, the diameter "d" of the IR fiducial marker 350 is approximately 190 μm but can range anywhere from between 150 μm to 230 μm. Further, in this embodiment, the outer ring 355 of IR fiducial marker 350 is of a thickness of about 20 μm and the thickness of inner ring 360 of IR fiducial marker 350 is also of a thickness of about 20 μm. The space 370 between the outer ring 355 and inner ring 360 of IR fiducial marker 350 is about 15 μm thick and the diameter of the space 373 within the inner edge 362 of inner ring 360 is about 80 μm. In an embodiment, the spacing 370 between the inner ring 360 and outer ring 355 structure is based upon how much mis-alignment tolerance is acceptable to ensure a good join. Thus, in this embodiment, up to a 50 μm shift would be within an acceptable limit.

Further, in the embodiment of FIG. 7, the corresponding IR fiducial marker 375 is a circular metal structure having a diameter of approximately 50 μm but can range anywhere from between 25 μm to 75 μm. The imaging of the fiducials 350, 375 as obtained in the columnar IR alignment inspection apparatus 100 gives a clear indication of go/no-go conditions of die alignment for easy operator detection.

FIG. 8A shows the results of optically exposing the separated die and substrate/laminate to IR light and observing the IR light reflections 145 of the IR fiducials as observed by the in-line IR camera corresponding to a case of the die 60 being aligned to the laminate 175. In FIG. 8A, the IR alignment inspection apparatus 100 can detect a reflection showing the IR fiducial marker 375 of the die placed clearly within the inner space 373 of the inner ring of the IR fiducial marker 350. In this embodiment, when the die is aligned to the laminate, the die fiducial 375 will be centered on the laminate fiducial 350 and which is indicative of an acceptable alignment of the pads/C4 or solder bumps. Upon such alignment detection shown in FIG. 6A, the system may then proceed with the die reflow to join the die and laminate.

FIG. 8B shows the results of optically exposing the separated die and substrate/laminate to IR light and observing the IR light reflections 145 of the IR fiducials as received by IR camera corresponding to the die 60 being mis-aligned to the laminate 175 however, within acceptable limits such that the die will self-align during the reflow process. In FIG. 8B, the columnar IR alignment inspection apparatus 100 can detect a reflection showing the IR fiducial marker 375 of the die having a portion or edge touching and/or encroaching the inner ring 360 of the ring-shaped IR fiducial marker 350 however, does not extend beyond an outer edge 364 of the inner ring 360 of the marker 350. The outer edge 364 is considered the self-alignment limit within which the die and laminate, though mis-aligned, is considered within acceptable limits and will self-align during reflow. If the die fiducial 375 is offset from the center of the laminate fiducial 350 but not extending beyond the outer limit 364 of the inner ring 360, it indicates that the die is within acceptable limits of self-alignment during reflow and is not a problem.

In contrast, FIG. 8C shows the results of optically exposing the separated die and substrate/laminate to IR light and observing the IR light reflections 145 of the IR fiducials as received by the IR camera corresponding to the die 60 being mis-aligned to the laminate 175 beyond acceptable limits. In FIG. 8C, the IR alignment inspection apparatus 100 can detect a reflection showing the IR fiducial marker 375 of the die offset from the laminate-center but touching the outermost ring 355 of the IR fiducial marker 350. An edge of IR fiducial marker 375 touching any portion of the outer ring 355 of IR fiducial marker 350 is indicative of offset/misalignment beyond acceptable limits and if reflowed as is shown in FIG. 8C, it will cause shorts in the module. This is a clear no-go condition and will trigger a rework.

Apart from go/no-go condition, the inner ring 360 of the laminate fiducial provides a reference to manually measure the magnitude of offset. If there is a trend seen in the offset direction and magnitude, there might be a possibility of tool/process shifts that can be analyzed and recalibrated if needed before it goes out of spec. Thus, the fiducial mark designs of FIG. 7 provide an ease of detection for go/no-go condition as well as the magnitude of offset.

Figures 9, 10A, 10B, 10C:
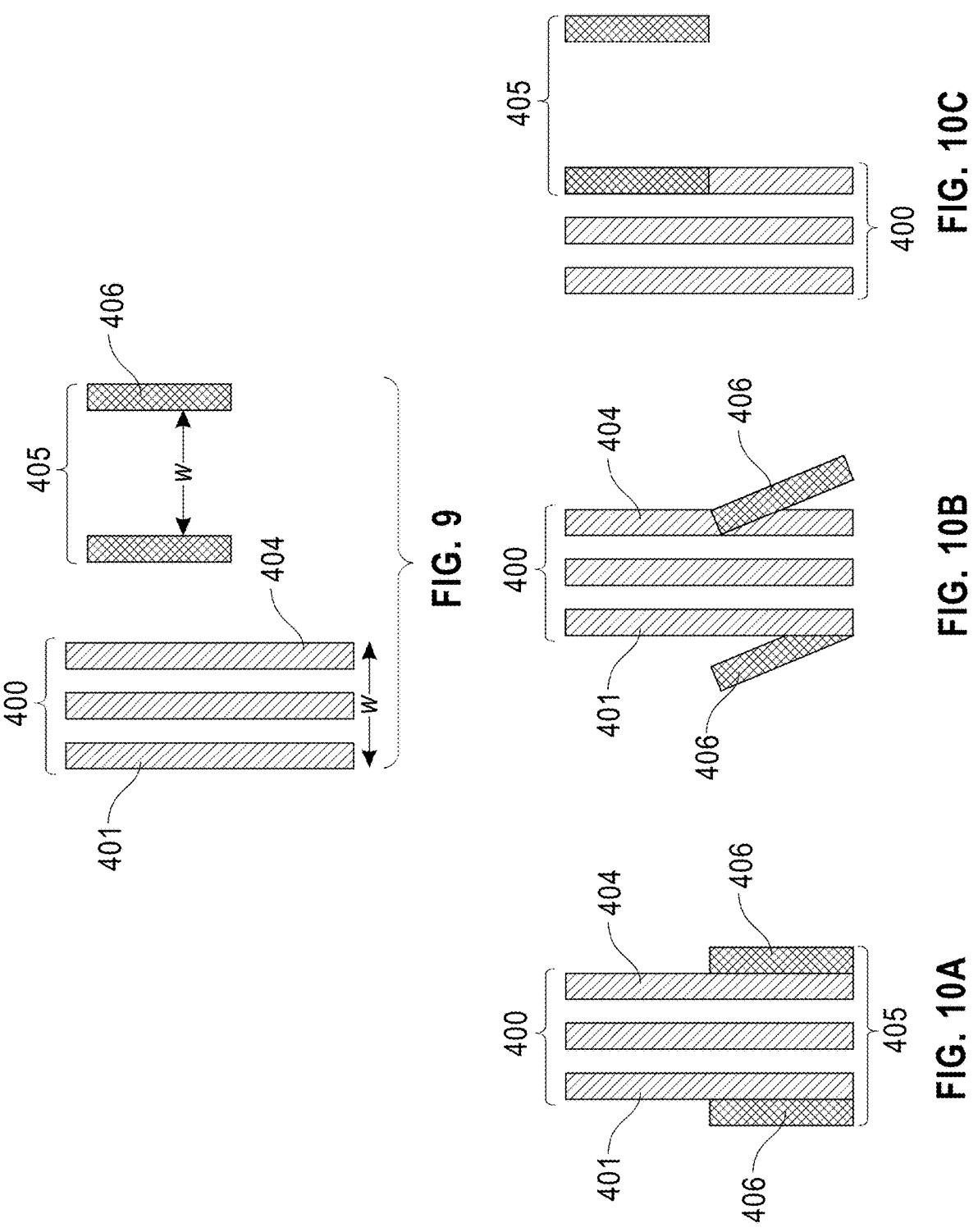
FIG. 9 depicts a further example of an IR fiducial marker to be formed on the electronic module (or die) and a corresponding further IR fiducial marker to be formed on the organic laminate (or substrate) according to an embodiment.
FIGS. 10A-10C depict the different results of optically exposing the separated die and substrate/laminate to IR light and observing the IR light reflections using the IR fiducial markers of FIG. 9.

FIG. 9 depicts a top-down view of a further example of an IR fiducial marker 400 to be formed on either of the die (or organic laminate carrier or substrate) and a further IR fiducial marker 405 to be formed on the other of the organic laminate or substrate (or die). For non-limiting illustrative purposes, the IR fiducial marker 400 is placed on a top or bottom surface of the substrate or organic laminate 175 and the corresponding second IR fiducial marker 405 is formed on the top or bottom surface of the die 60. In this embodiment, IR fiducial marker 400 is a series of spaced apart metal rectangle structures 401 that are aligned and have equal heights. In an embodiment, IR fiducial marker 400 consists of two or more spaced-apart horizontally-aligned rectangular structures 401 each having a width of approximately 10 μm (+/−5 μm) and a height of approximately 60 μm (+/−5 μm) and each separated by a gap of approximately 10 μm (+/−5 μm). In embodiments, the upper end range of the heights can be increased with only an occupied space penalty. In the non-limiting embodiment depicted, the IR fiducial marker 400 is a series of three rectangle structures 401 formed at the substrate or laminate surface. Further, in this embodiment, the corresponding IR fiducial marker 405 formed at the die is also a series of smaller rectangle structures 406 having a width of approximately 10 μm (+/−5 μm) and a height of approximately 30 μm (+/−5 μm). In embodiments, the upper end range of both the widths and heights can be increased with only an occupied space penalty. In an embodiment, metal fiducial marker 405 at the die consists of two spaced-apart horizontally-aligned rectangular structures 406 that are separated by a gap "w" of about 50 μm. As shown in FIG. 9, this gap "w" can correspond to the distance between an outer edge of a first rectangle structure 401 and the outer edge of the last rectangle structure 404. As in the other embodiments, the imaging of the fiducials 400, 405 as obtained in the columnar IR alignment inspection apparatus 100 gives a clear indication of go/no-go conditions of die alignment for easy operator detection.

FIG. 10A shows the results of optically exposing the separated die and substrate/laminate to IR light and observing the IR light reflections 145 of the IR fiducials as received by the IR camera corresponding to a case of the die 60 being aligned to the laminate 175. In FIG. 10A, the IR alignment inspection apparatus 100 can detect a reflection showing the IR fiducial marker 405 of the die to cleanly align horizontally with the whole IR fiducial marker 400 of the laminate. That is, the reflections will detect that an inner edge of a rectangle 406 of the IR fiducial marker 405 will abut the outer edge of the outer most rectangles 401, 404 of the IR fiducial marker 400. Further, for alignment, the reflections will detect that a bottom edge of rectangles 406 of the IR fiducial marker 405 will horizontally align with a bottom edge of rectangles 401, 404 of the IR fiducial marker 400. In this embodiment shown in FIG. 10A, when the rectangles of laminate fiducial marker 400 are horizontally aligned within the gap "w" of the IR fiducial marker 405, this is indicative of an acceptable alignment of the pads/C4 or solder bumps of the die and laminate. Upon such alignment detection shown in FIG. 10A, the system may then proceed with the die reflow to join the die and laminate.

The line width and distances between these markers 400, 405 can be tailored such that offsets can be measured either manually or on the tool using reference points on these fiducials. The line width and distances between these markers 400, 405 can be tailored such that offsets can be measured either manually or in an automated tool allowing granularity between perfect alignment and a failing condition.

FIG. 10B shows the results of optically exposing the separated die and substrate/laminate to IR light and observing the IR light reflections 145 of the IR fiducials as received by IR camera corresponding to the die 60 being mis-aligned to the laminate 175 although centered. In FIG. 10B, the columnar IR alignment inspection apparatus 100 can detect a reflection showing the IR fiducial marker 405 being centered on the laminate marker but rotated. In FIG. 10B, the rotation is exaggerated for clarity. That is, each rectangle 406 of the die fiducial marker 405 is detected as being rotated/slanted with respect to the rectangles 401 of the laminate fiducial marker 400 although still centered within the gap "w". Thus, while still being centered, the die is detected as slightly rotated with respect to the laminate which is indicative that adjacent C4s could bridge during the reflow process, i.e., that the die is not within acceptable limits of self-alignment during reflow and is a problem to be reworked. In an embodiment, the go/no-go on permanent joining is based on the self-alignment limit of the solder to pull into correct alignment.

FIG. 10C shows the results of optically exposing the separated die and substrate/laminate to IR light and observing the IR light reflections 145 of the IR fiducials as received by the IR camera corresponding to a case of the die 60 being mis-aligned to the laminate 175, i.e., die markers 405 are vertically and horizontally shifted to the top right. In FIG. 10C, the IR alignment inspection apparatus 100 can detect a reflection showing the IR fiducial marker 405 of the die clearly mis-aligned, i.e., both vertically and horizontally offset or shifted (in X and/or Y direction) with respect to the IR fiducial marker 400 of the laminate. In this embodiment shown in FIG. 10C, when the rectangles 401 of laminate fiducial marker 400 are horizontally and/or vertically offset with respect to the rectangles 406 of die IR markers, this is indicative of an unacceptable alignment of the pads/C4 or solder bumps of the die and laminate. Upon such a mis-alignment detection shown in FIG. 10C, the adjacent C4s could bridge during the reflow process and is a problem to be reworked. Also, the laminate fiducials 400 act as reference guides for measuring magnitude of offset by operators and on the tool. That is, besides detecting a perfect alignment and detecting a no-go condition, in all embodiments, the system processor could also record offsets between these conditions based on the fiducial positions.

Figures 11, 12A, 12B, 12C, 12D:
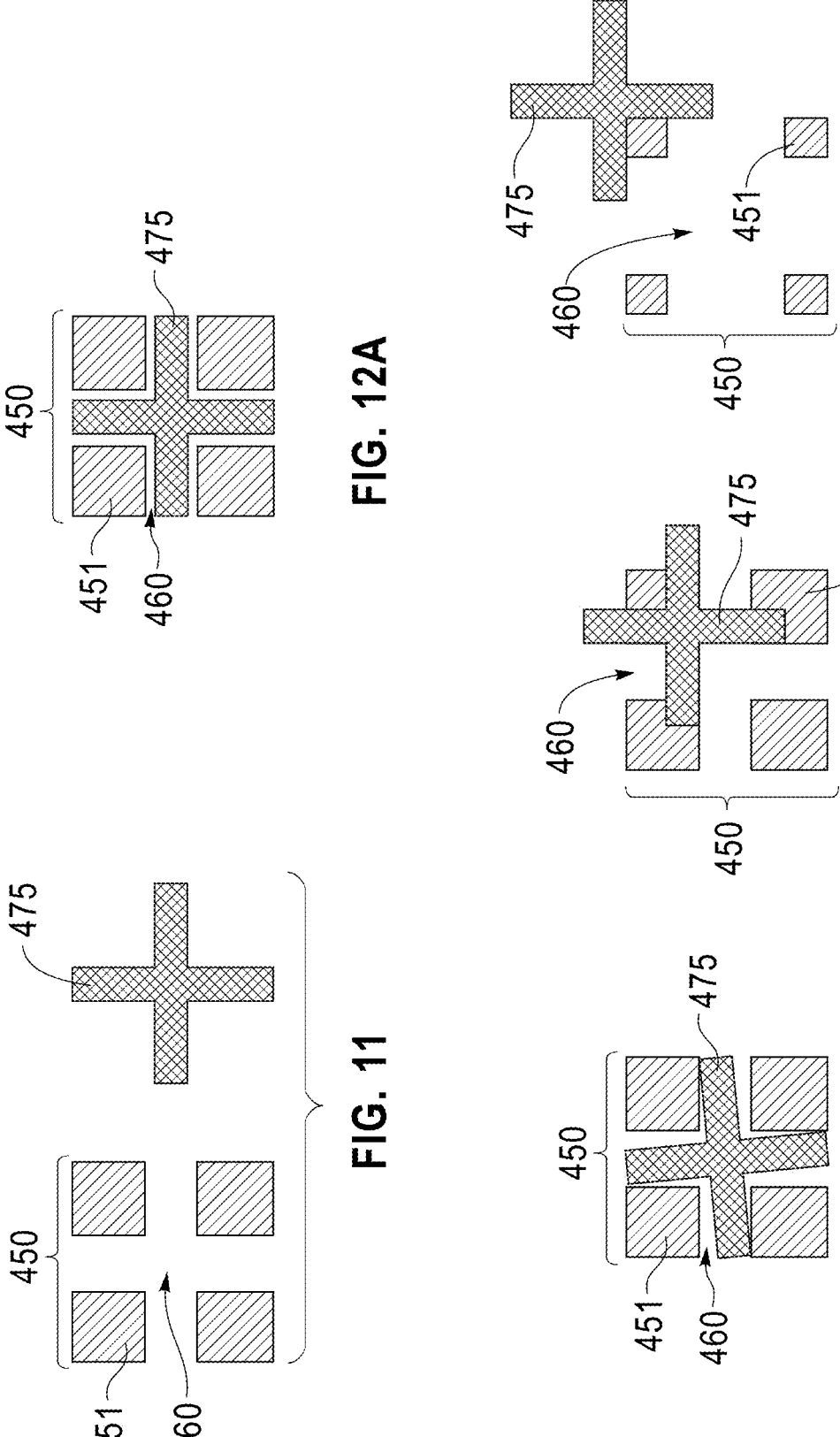
FIG. 11 depicts a further example of an IR fiducial marker to be formed on the electronic module (or die) and a corresponding further IR fiducial marker to be formed on the organic laminate (or substrate) according to a further embodiment.
FIGS. 12A-12D depict the different results of optically exposing the separated die and substrate/laminate to IR light and observing the IR light reflections using the IR fiducial markers of FIG. 11.

FIG. 11 depicts a further example of an IR fiducial marker 450 to be formed on either of the die (or organic laminate or substrate) and a further IR fiducial marker 475 to be formed on the other of the organic laminate or substrate (or die). For non-limiting illustrative purposes, the IR fiducial marker 450 is placed on a top or bottom surface of the substrate or organic laminate 175 and the corresponding second IR fiducial marker 475 is formed on the top or bottom surface of the die 60. In this embodiment, IR fiducial marker 450 is a structure comprising a layout of four square metal structures 451, in particular, a symmetric orientation of horizontally and vertically spaced apart square structures 451 defining a cross-shaped gap 460. In a non-limiting illustrative embodiment, the dimensions of a side of each square metal structure 451 is about 20 μm and the cross-shaped gap 460 can be a width of about 10 μm. Further, in this embodiment, the corresponding IR fiducial marker 475 formed at the die is a cross-shaped metal structure dimensioned to correspond to the size of the gap 460 of the laminate IR fiducial marker 450. For example, the IR fiducial marker 475 is about a 20 μm wide cross-shape dimensioned to fit within the gap 60 to verify alignment of the die and laminate.

FIG. 12A shows the results of optically exposing the separated die and substrate/laminate to IR light and observing the IR light reflections 145 of the IR fiducials as received by the IR camera corresponding to a case of the die 60 being aligned to the laminate 175. In FIG. 12A, the IR alignment inspection apparatus 100 can detect a reflection showing the IR fiducial marker 475 of the die placed clearly within the cross-shaped gap 460 of the laminate IR fiducial marker 450. In this embodiment, when the die is aligned to the laminate, the die fiducial 475 will be centered on the laminate fiducial 450 and which is indicative of an acceptable alignment of the pads/C4 or solder bumps. Upon such alignment detection shown in FIG. 12A, the system may then proceed with the reflowing of the die with assurance of a successful chip-join process.

In contrast, FIG. 12B shows the results of optically exposing the separated die and substrate/laminate to IR light and observing the IR light reflections 145 of the IR fiducials as received by the IR camera corresponding to the die 60 being mis-aligned to the laminate 175. In FIG. 12B, the columnar IR alignment inspection apparatus 100 can detect a reflection showing the IR fiducial marker 475 of the die centered but rotated with respect to the laminate IR fiducial marker 450. Any rotations in the die placement (FIG. 12B) will be visible during fiducial detection under the IR camera and the die placement can be corrected/reworked prior to reflowing the module.

FIG. 12C shows the results of optically exposing the separated die and substrate/laminate to IR light and observing the IR light reflections 145 of the IR fiducials as received by the IR camera corresponding to the die 60 being misaligned to the laminate 175. In FIG. 12C, the columnar IR alignment inspection apparatus 100 can detect a reflection showing the IR fiducial marker 475 of the die shifted and offset horizontally and vertically to the top right (in X and/or Y direction) with respect to the laminate IR fiducial marker 450. Any shifting/misalignment in the die placement (FIG. 12C) will be visible during fiducial detection under the IR camera and the die placement can be corrected/reworked prior to reflowing the module.

Similarly, FIG. 12D shows the results of optically exposing the separated die and substrate/laminate to IR light and observing the IR light reflections 145 of the IR fiducials as received by the IR camera corresponding to the die 60 being mis-aligned to the laminate 175. In FIG. 12D, the columnar IR alignment inspection apparatus 100 can detect a reflection showing the IR fiducial marker 475 of the die shifted and offset horizontally and vertically (in X and/or Y direction) further to the top right with respect to the laminate IR fiducial marker 450. Any shifting/misalignment in the die placement (FIG. 12C) will be visible during fiducial detection under the IR camera and the die placement can be corrected/reworked prior to reflowing the module.

Using flip-chip bumps with a process target of 100 μm diameter, in the mis-alignment shown in FIG. 4D, if die is offset by >50% of bump diameter, it is a no-go condition. This may be acceptable if up to 50 μm offset is acceptable. Once an operator starts seeing a gap between the squares 451 and the cross 475, it can be declared a reject or a no-go condition. The die is then subjected to rework.

In view of the exemplary optical results shown in FIGS. 6A-6C, 8A-8C, 10A-10C, and 12A-12D, an operator of the columnar IR alignment inspection apparatus 100 can make a quick visual go/no-go call on alignment. For example, when the fiducials on the die are aligned with the fiducials on the laminate as shown in FIGS. 6A, 8A, 10A and 12A, the die 60 is placed on the laminate 175 accurately and reflowing the die then ensures a successful chip-join process. Any rotations/misalignments in the die placement will be visible during fiducial detection under the IR camera and the die placement can be corrected/reworked prior to reflowing the module.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A system for joining an electronic module to a laminate structure comprising:

an assembly comprising an electronic module disposed on a laminate structure to be joined to the electronic module, the electronic module having a first alignment marker at a first location on or in the electronic module and the laminate structure having a second alignment marker at a second location on or in the laminate structure, said first location and second location being separated by a distance greater than a 0.5% die size apart;

an in-line infrared (IR) light inspection apparatus disposed above the assembly, the IR light inspection apparatus comprising:

an infrared light source providing incident IR light upon the assembly;

an IR camera for obtaining images based on IR light reflected from the assembly, the obtained images including a concurrent relative positioning of the first location of the first alignment marker and the second location of the second alignment marker, said concurrent relative positioning of the first alignment marker and second alignment marker determining a degree of alignment between the electronic module and said laminate structure; and a solder reflow apparatus configured to perform or not perform a solder reflow process to electrically join the electronic module to the laminate structure in response to the concurrent relative positioning of the first location of the first alignment marker relative to the second location of said second alignment marker, wherein said second alignment marker comprises one or more reference guides facilitating, by an operator, an immediate visual measure of the degree of alignment between said electronic module and the laminate structure, a reference guide indicating a degree of alignment of a granularity ranging between an exact alignment, a mis-alignment correlated to an acceptable limit of self-alignment during solder reflow process that instructs performing the solder reflow process, or a mis-alignment exceeding an acceptable limit of self-alignment that instructs not performing the solder reflow process.

2. The system as claimed in claim 1, wherein said first alignment marker comprises one or more metal structures formed on or embedded within the electronic module and the second alignment marker comprises one or more metal structures formed on or embedded within the laminate structure.

3. The system as claimed in claim 1, wherein said first alignment marker comprises a circle structure and said second alignment marker comprises a ring structure, wherein based on the obtained images, the electronic module is determined aligned for joining to said laminate structure when a location of said circle structure is wholly within the ring structure.

4. The system as claimed in claim 1, wherein said first alignment marker comprises a circle structure and said second alignment marker comprises a structure having two concentric rings, wherein based on the obtained images, the electronic module is determined aligned for joining to said laminate structure when a location of said circle structure is detected wholly within an inner ring structure of the two concentric rings, or when an edge of said circle structure does not extend beyond an outer edge of the inner ring structure of the two concentric rings.

5. The system as claimed in claim 1, wherein said first alignment marker comprises two spaced-apart horizontally-aligned rectangular structures defining a gap therebetween and said second alignment marker comprises two or more spaced-apart horizontally-aligned rectangular structures, wherein based on the obtained images, the electronic module is determined aligned for joining to said laminate structure when the two or more spaced-apart horizontally-aligned rectangular structures is detected wholly within the gap such that an inner edge of each of the two spaced-apart horizontally-aligned rectangular structures abuts outer edges of a first rectangular structure and last rectangular structure of the two or more spaced-apart horizontally-aligned rectangular structures.

6. The system as claimed in claim 5, wherein the electronic module is further determined aligned for joining to said laminate structure when a bottom or top edge of each the two or more spaced-apart horizontally-aligned rectangular structures is detected horizontally aligned with a respective bottom or top edge of the two spaced-apart horizontally-aligned rectangular structures.

7. The system as claimed in claim 5, wherein the electronic module is determined mis-aligned to said laminate structure when the two spaced-apart horizontally-aligned rectangular structures are rotated with respect to an orientation of the two or more spaced-apart horizontally-aligned rectangular structures.

8. The system as claimed in claim 5, wherein the electronic module is determined mis-aligned to said laminate structure when the two spaced-apart horizontally-aligned rectangular structures are shifted horizontally, vertically or both horizontally and vertically with respect to an orientation of the two or more spaced-apart horizontally-aligned rectangular structures.

9. The system as claimed in claim 1, wherein said first alignment marker comprises a cross-shaped structure and the second alignment marker comprises a symmetric orientation of horizontally and vertically spaced apart square structures defining a cross-shaped gap, wherein based on the obtained images, the electronic module is determined aligned for joining to said laminate structure when the cross-shaped structure is wholly located with the cross-shaped gap.

10. The system as claimed in claim 9, wherein the electronic module is determined mis-aligned to said laminate structure when the cross-shaped structure is rotated with respect to an orientation of the defined cross-shaped gap.

11. The system as claimed in claim 9, wherein the electronic module is determined mis-aligned to said laminate structure when the cross-shaped structure is shifted horizontally, vertically or both horizontally and vertically with respect to an orientation of the defined cross-shaped gap.

12. The system as claimed in claim 1, wherein at least one of the electronic module or laminate structure comprises a plurality of: conductive pad structures and a corresponding solder ball structure located at a surface thereof, wherein a determined alignment of the first alignment marker and the second alignment marker ensures accurate alignment of the respective conductive pad and solder ball structures to ensure successful join of said electronic module to said laminate by said solder reflow process.

13. The system as claimed in claim 1, further comprising:
a hardware processor associated with said in-line infrared (IR) light inspection system, the hardware processor adapted to:
receive and analyze said obtained images including analyzing the concurrent relative positioning of the first and second locations of the first alignment marker and the second alignment marker; and
responsively determine a magnitude of any offset, shift or degree of mis-alignment based on the analyzed locations, and determine whether to perform the solder reflow process to electrically join the electronic module to the laminate structure or alternatively to prevent the reflow process based upon the determined magnitude of the offset, shift or degree of mis-alignment.

14. A method of verifying alignment of electronic structures to laminates comprising:
providing an assembly comprising an electronic module situated on a laminate structure to be joined to said electronic module, the electronic module having a first alignment marker at a first location on or in the electronic module and the laminate structure having a second alignment marker at a second location on or in the laminate structure, said first location and second location being separated by a distance greater than a 0.5*die size apart;
providing incident infrared (IR) light to said assembly from a location above said assembly;
obtaining images based on IR light reflected from the assembly, the obtained images including a concurrent relative positioning of the first location of the first alignment marker and the second location of the second alignment marker;
detecting, based on the concurrent relative positioning of the first location of the first alignment marker and the second location of the second alignment marker, a degree of alignment between the electronic module and the laminate structure; and
one of: performing, based on the detected degree of alignment, a solder reflow process to electrically join the electronic module to the laminate structure or alternatively to prevent the reflow process,
wherein said second alignment marker comprises one or more reference guides facilitating, by an operator, an immediate visual measure of the degree of alignment between said electronic module and the laminate structure, a reference guide indicating a degree of alignment of a granularity ranging between an exact alignment, a mis-alignment correlated to an acceptable limit of self-alignment during solder reflow process that instructs performing the solder reflow process, or a mis-alignment exceeding an acceptable limit of self-alignment that instructs not performing the solder reflow process.

15. The method as claimed in claim 14, wherein said first alignment marker comprises a circle structure of metal material and said second alignment marker comprises a single ring structure or a structure having two or more concentric ring structures of metal material, the method further comprising:
determining, based on the obtained images, the electronic module is aligned for joining to said laminate structure when a location of said circle structure is wholly within the single ring structure or within an inner ring structure of the two or more concentric ring structures.

16. The method as claimed in claim 14, wherein said first alignment marker comprises two spaced-apart horizontally-aligned rectangular structures defining a gap therebetween and said second alignment marker comprises two or more spaced-apart horizontally-aligned rectangular structures, the method further comprising:
determining, based on the obtained images, the electronic module is aligned for joining to said laminate structure when the two or more spaced-apart horizontally-aligned rectangular structures are located wholly within the gap such that an inner edge of each of the two spaced-apart horizontally-aligned rectangular structures of the first alignment marker abuts outer edges of a first rectangular structure and last rectangular structure of the two or more spaced-apart horizontally-aligned rectangular second alignment marker structures and when a bottom or top edge of each the two or more spaced-apart horizontally-aligned rectangular structures is detected horizontally aligned with a respective bottom or top edge of the two spaced-apart horizontally-aligned rectangular structures.

17. The method as claimed in claim 14, wherein said first alignment marker comprises a cross-shaped structure and the second alignment marker comprises horizontally and vertically spaced apart square structures symmetrically oriented to define a cross-shaped gap, the method comprising:

determining, based on the obtained images, the electronic module is aligned for joining to said laminate structure when the cross-shaped structure is located wholly within the cross-shaped gap.

18. The method as claimed in claim 14, further comprising:

determining, based on the obtained images, the electronic module is mis-aligned to said laminate structure when a concurrent relative positioning of the first location of the first alignment marker and the second location of the second alignment marker is shifted horizontally, vertically or both horizontally and vertically relative to each other, said method further comprising:

receiving, by a hardware processor, said obtained images; and analyzing, by the hardware processor, the concurrent relative positioning of the first location of the first alignment marker and the second location of the second alignment marker; and one of: performing, based on the determined magnitude of any offset, shift or degree of mis-alignment based on relative locations of said first alignment marker and the second alignment marker a reflow process to electrically join the electronic module to the laminate structure or alternatively to prevent the reflow process based upon the determined magnitude of the offset, shift or degree of mis-alignment.

19. An apparatus for verifying an alignment of an electronic module to a laminate structure, the apparatus comprising:

an in-line infrared (IR) inspection apparatus comprising:

an infrared (IR) light source; and an IR camera for receiving reflected IR light, the IR light source disposed vertically above a carrier holding an assembly comprising an electronic module situated on a laminate structure to be joined to said electronic module, the electronic module having a first alignment marker at a first location on or in the electronic module and the laminate structure having a second alignment marker at a second location on or in the laminate structure, the first location of the first alignment marker and second location of the second alignment marker being separated by a pre-determined distance greater than a 0.5*die size apart, and the IR light source providing incident IR light upon the carrier and the IR camera receiving reflected IR light signals providing images comprising a concurrent relative positioning of the first location of the first alignment marker relative to the second location of the second alignment marker, wherein the alignment of the electronic module to said laminate structure is verified or not verified based on the relative locations of the first alignment marker and second alignment marker, wherein said second alignment marker comprises one or more reference guides facilitating, by an operator, an immediate visual measure of the degree of alignment between said electronic module and the laminate structure, a reference guide indicating a degree of alignment of a granularity ranging between an exact alignment, a mis-alignment correlated to an acceptable limit of self-alignment during solder reflow process that instructs performing the solder reflow process, or a mis-alignment exceeding an acceptable limit of self-alignment that instructs not performing the solder reflow process.

20. The alignment verification system as claimed in claim 19, wherein the pre-determined distance is equal to or greater than 20 μm.

\* \* \* \* \*